United States Patent
Teng et al.

[11] Patent Number: 6,034,439
[45] Date of Patent: Mar. 7, 2000

[54] METHOD AND STRUCTURE FOR PREVENTING BONDING PADS FROM PEELING CAUSED BY PLUG PROCESS

[75] Inventors: Kuo-Shi Teng, Taipei Hsien; Hao-Chieh Yung, Hsinchu; Shing-Shing Chiang, Hsinchu Hsien; Wen-Haw Lu, Taipei, all of Taiwan

[73] Assignee: Winbond Electronics Corporation, Taiwan

[21] Appl. No.: 09/041,020

[22] Filed: Mar. 12, 1998

[30] Foreign Application Priority Data

Feb. 7, 1998 [TW] Taiwan ................................. 87101660

[51] Int. Cl.$^7$ ........................ H01L 23/48; H01L 23/52; H01L 29/40

[52] U.S. Cl. .................... 257/786; 257/773; 257/774; 257/763; 257/764; 257/765

[58] Field of Search ................................. 257/786, 774, 257/773, 750, 758, 764, 765, 763, 754

[56] References Cited

U.S. PATENT DOCUMENTS

| | | | |
|---|---|---|---|
| 4,984,061 | 1/1991 | Matsumoto | 257/786 |
| 5,248,903 | 9/1993 | Heim | 257/781 |
| 5,270,256 | 12/1993 | Bost et al. | 438/666 |
| 5,430,329 | 7/1995 | Harada et al. | 257/786 |
| 5,686,762 | 11/1997 | Langley | 257/786 |
| 5,841,197 | 11/1998 | Adamic, Jr. | 257/781 |

FOREIGN PATENT DOCUMENTS

| | | | |
|---|---|---|---|
| 62-299052 | 12/1987 | Japan | 257/786 |
| 2-3944 | 1/1990 | Japan | 257/786 |
| 3-188634 | 8/1991 | Japan | 257/786 |

*Primary Examiner*—Mahshid Saadat
*Assistant Examiner*—Jhihan B. Clark
*Attorney, Agent, or Firm*—Birch, Stewart, Kolasch & Birch, LLP

[57] ABSTRACT

A method for preventing bonding pads from peeling caused by plug process comprises the following steps. First, a substrate is prepared, and then a first conductor is formed on the substrate. Next, a dielectric layer is formed on the first conductor. After that, a big contact window and a plurality of small contact windows are formed on the dielectric layer, wherein the plurality of small contact windows are located around the big window, and the sizes of the big contact window and small contact windows are over 3 $\mu$m. Subsequently, a metal plug layer is formed on the dielectric layer, big contact window and small contact windows. Thereafter, the metal plug layer is etched back to form metal spacers on the sidewalls of the big contact window and small contact windows. Finally, a second conductor is formed on the dielectric layer, big contact window, small contact windows and metal spacers. Since the second conductor is directly connected to the first conductor in the invention, bonding pads peeling can be thoroughly prevented during connecting between the bonding pads and outside pins.

5 Claims, 3 Drawing Sheets

METHOD AND STRUCTURE FOR PREVENTING BONDING PADS FROM PEELING CAUSED BY PLUG PROCESS

BACKGROUND OF THE INVENTION

1. Field of the Invention

The invention relates to semiconductor process, and in particular to a method and structure for preventing bonding pads from peeling caused by plug process.

2. Description of the Prior Art

In the past, when tungsten plug process used for connections between different metal layers had not been introduced into semiconductor process, poor contacts on bonding pads never occurred. As shown in FIG. 1, a structure for manufacturing boding pads without tungsten plug process involved is shown, wherein reference numerals 10, 12, 14, 16 and 18 indicate substrate, polysilicon layer, oxide layer, aluminum layer and passivation, respectively. Since the aluminum layer 16 is directly and firmly connected to the polysilicon layer 12, the bonding pads cannot peel to cause poor contacts as the bonding pads are connected with outside pins.

However, after the tungsten plug process has been introduced into semiconductor process, bonding pads peeling frequently occurs when the bonding pads are connected with outside pins. As shown in FIG. 2, a structure for manufacturing bonding pads with use of tungsten plug process according to the prior art is shown, wherein reference numerals 10, 12, 14, 15, 16 and 18 represent substrate, polysilicon, oxide layer, tungsten plug layer, aluminum layer and passivation. It's obvious from FIG. 2 that the polysilicon layer 12 is indirectly connected to the aluminum layer 16 via the tungsten plug layer 15. Due poor adhesive force between the tungsten plug layer 15 and the polysilicon layer 12, the connection between the tungsten plug layer 15 and the polysilicon layer 12 easily loosens, resulting in bonding pads peeling.

SUMMARY OF THE INVENTION

In view of the above, the object of the invention is to provide a method for preventing bonding pads from peeling caused by plug process. This method, suitable for a substrate, according to the invention comprises the followings steps. First, a first conductor is formed on the substrate. A dielectric layer is formed on the first conductor. A big contact window and a plurality of small contact windows are formed on the dielectric layer, wherein the plurality of small contact windows are located around the big contact window, and the sizes of the big contact window and plurality of small contact windows are over 3 µm. A metal plug layer is formed on the dielectric layer, big contact window and plurality of small contact windows. The metal plug layer is etched back to form metal spacers on the sidewalls of the big contact window and small contact windows. Finally, a second conductor is formed on the dielectric layer, big contact window, small contact windows and metal spacers.

As can be known from the above, since the sizes of the big contact window and small contact windows are large enough not to be filled completely with the deposited metal plug layer, that is, the metal plug layer is formed only on the surfaces of the big contact window and small contact windows, most part of the metal plug layer can be removed by use of etch back process, and only small part of the metal plug layer, namely metal spacers, still remains on the sidewalls of the big contact window and small contact windows. Based on the above, it can be realized that the second conductor is directly connected to the first conductor without use of the metal plug layer for connection. Therefore, bonding pads peeling caused by plug process as stated in the prior art can be thoroughly prevented. Furthermore, since the plurality of small contact windows are formed around the big contact window, better contacts can be expected by having these surrounding small contact windows for further connections, even though soldering points are slightly away from the centers of bonding pads during connecting between the bonding pads and outside pins.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE EMBODIMENT

Figure 1:
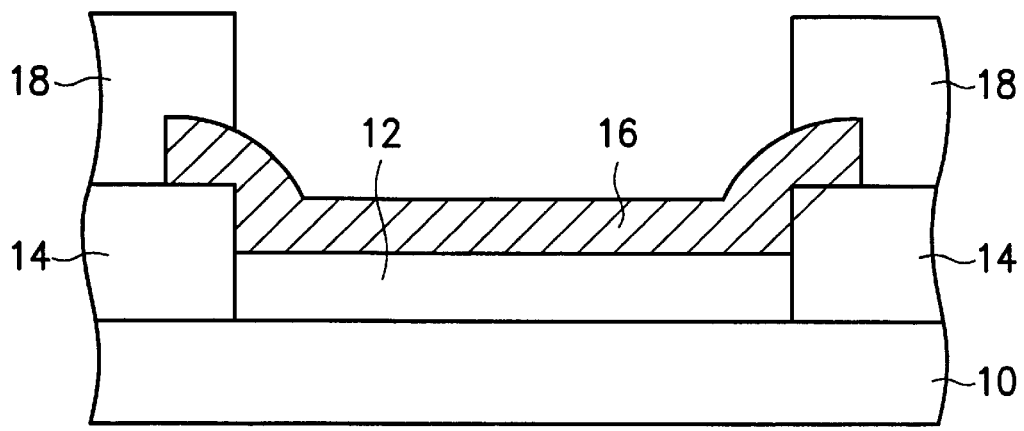
FIG. 1 is a cross-sectional view illustrating a structure for manufacturing bonding pads without tungsten plug process involved according to the prior art.
Figure 2:
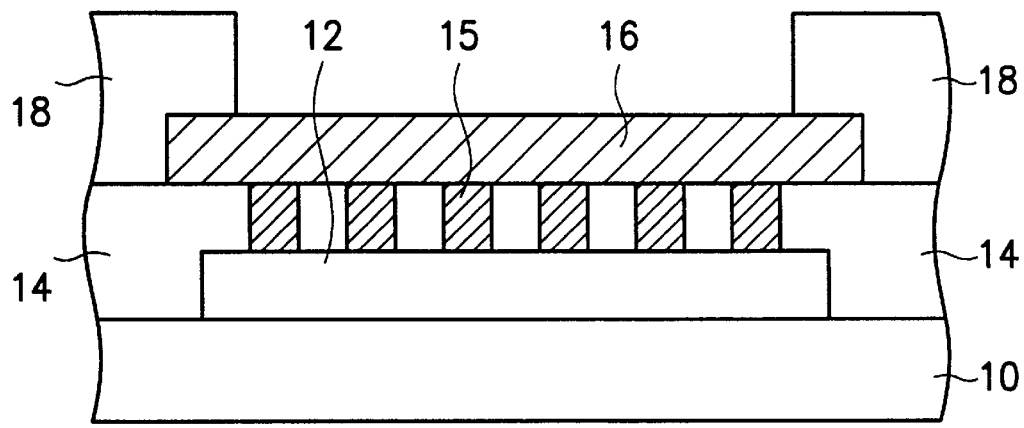
FIG. 2 is a cross-sectional view illustrating a structure for manufacturing boding pads with W plug process involved according to the prior art.
Figure 3:
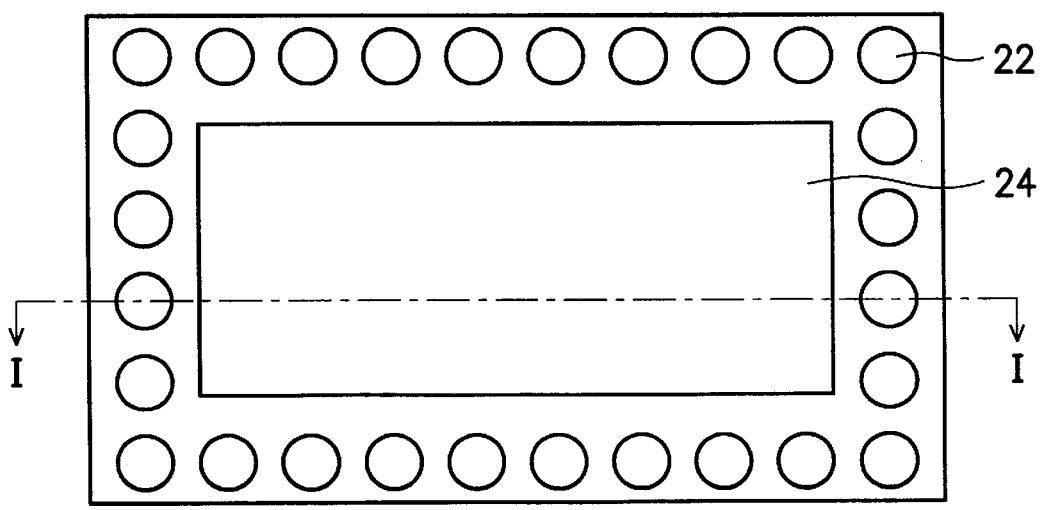
FIG. 3 is a top view of a bonding pad manufactured by a method for preventing bonding pads from peeling caused by plug process according to an embodiment of the invention.

Referring to FIG. 3, a top view of a bonding pad manufactured by a method for preventing bonding pads from peeling caused by plug process according to an embodiment of the invention is shown, wherein reference numerals 22 and 24 indicate small contact windows and big contact window, respectively. FIGS. 4A~4G are cross-sectional views along line I—I of FIG. 3, illustrating a method for preventing bonding pads from peeling caused by plug process according to an embodiment of the invention. This method according to the invention comprises the following steps.

Figure 4A:
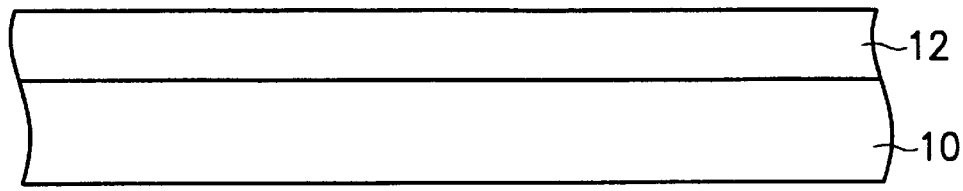
FIGS. 4A~4G are cross-sectional views illustrating a method for preventing bonding pads from peeling caused by plug process according to an embodiment of the invention.
Figure 4B:
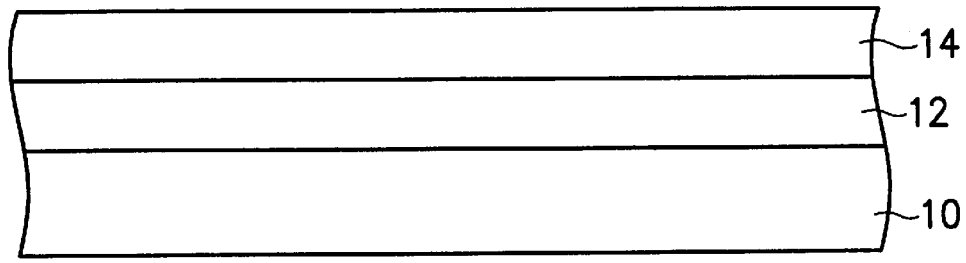
Figure 4C:
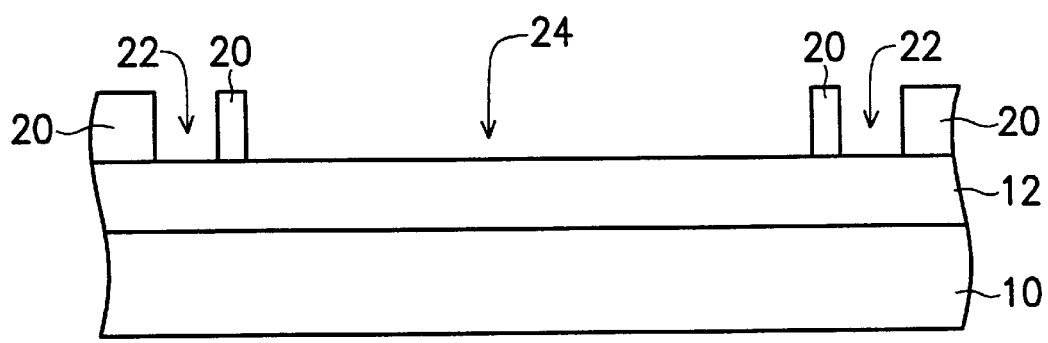
Figure 4D:
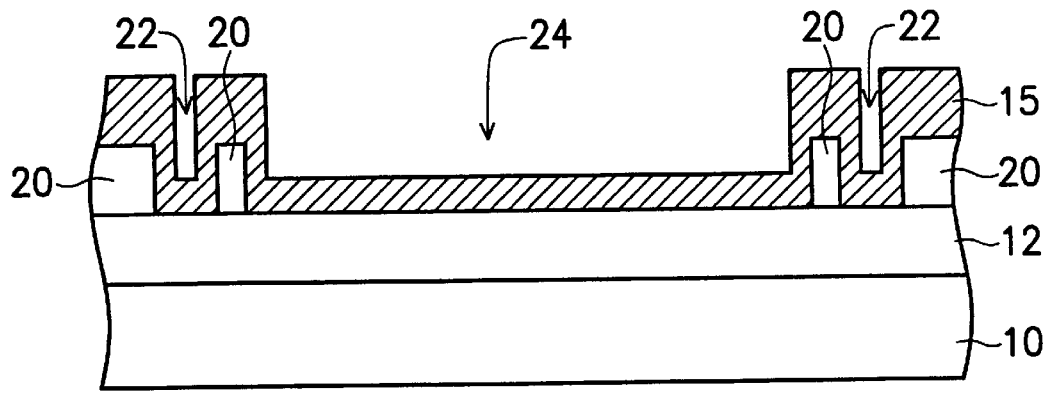
Figure 4E:
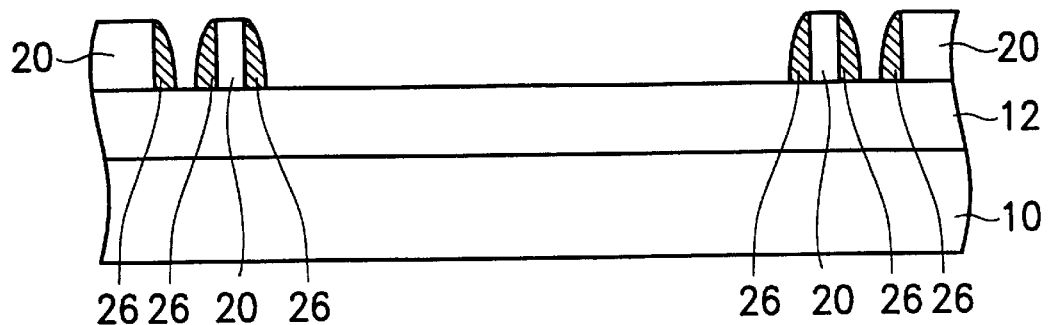
Figure 4F:
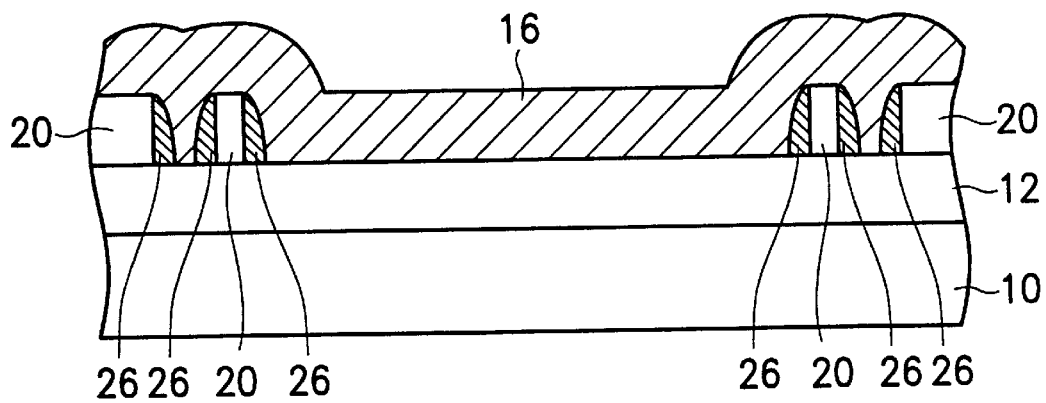

Step 1:

As shown in FIG. 4A, a substrate 10 is prepared, and then a first conductor 12, such as polysilicon layer, is formed on the substrate 10 by use of a CVD method;

Step 2:

As shown in FIG. 4B, a dielectric layer 14, such as oxide layer, is formed on the first conductor 12 by use of a CVD method;

Step 3:

As shown in FIG. 4C, a dielectric layer 20, a big contact window 24 and a plurality of small contact windows 22 (just two of them are shown) are formed by performing photolithography and plasma etching processes on the dielectric layer 14, wherein the plurality of small contact windows 22 are located around the big window 24, and the sizes of the big contact window 24 and the plurality of small contact windows 22 are over 3 µm;

Step 4:

As shown in FIG. 4D, a metal plug layer 15, such as tungsten plug layer, is formed on the dielectric layer 20, big contact window 24 and small contact windows 22 by use of a CVD method;

Step 5:

As shown in FIG. 4E, the metal plug layer 15 is etched back to form metal spacers 26 on the sidewalls of the big contact window 24 and small contact windows 22 by use of an isotropic plasma etching method; and Step 6:

As shown in FIG. 4F, a second conductor 16, such as aluminum layer, is formed on the dielectric layer 20, big contact window 24, small contact windows 22 and metal spacers 26.

Figure 4G:
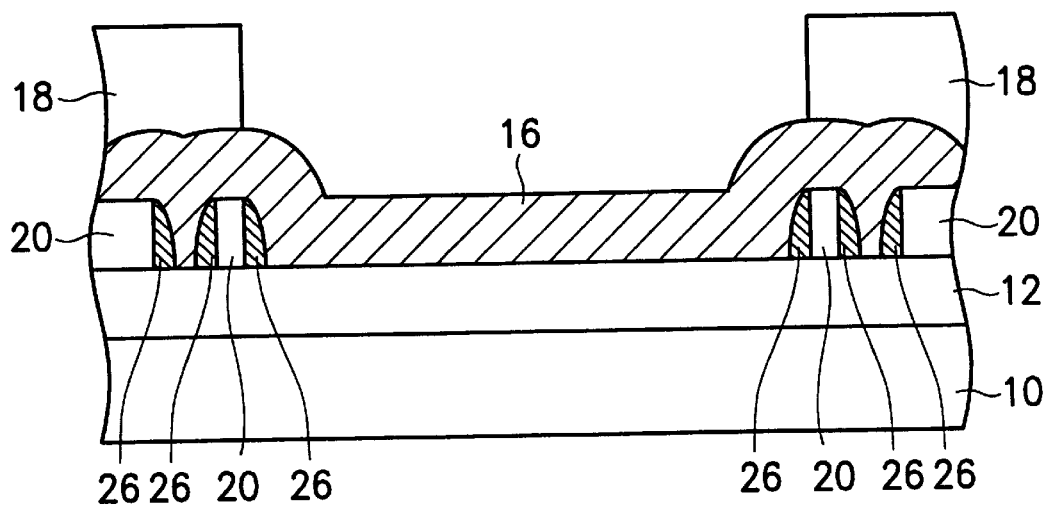

Step 7:

As shown in FIG. 4G, a passivation 18 is formed over the substrate 10 outside the big contact window 24 by use of a CVD method.

According to this method for preventing bonding pads from peeling caused by plug process, since the sizes of the big contact window and small contact windows are large enough not to be filled completely with the deposited metal plug layer, that is, the metal plug layer is formed only on the surfaces of the big contact window and small contact windows, most part of the metal plug layer can be removed by use of etch back process, and only small part of the metal plug layer, namely metal spacers, still remains on the sidewalls of the big contact window and small contact windows. Based on the above, it is clear that the second conductor is directly connected to the first conductor without use of the metal plug layer for connection. Therefore, bonding pads peeling caused by plug process in the prior art can be efficiently prevented. In addition, since the plurality of small contact windows are formed around the big contact window, better contacts can be obtained by having the outside small contact windows for further connections, even though soldering points are slightly away from the centers of bonding pads during connecting between the bonding pads and outside pins.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A structure for preventing bonding pads from peeling caused by plug process, suitable for a substrate, comprising:

a first conductor formed on said substrate;

a dielectric layer formed on said first conductor, wherein there are a big contact window and a plurality of small windows with sizes of over 3 $\mu$m, wherein said big contact window is surrounded by said small contact windows;

metal spacers formed on the sidewalls of said big contact window and said small contact windows; and a second conductor formed on said dielectric layer, said big contact window, said small contact windows and said metal spacers.

2. A structure for preventing bonding pads from peeling caused by plug process as claimed in claim 1, further comprising:

a passivation formed over said substrate outside said big contact window.

3. A structure for preventing bonding pads from peeling caused by plug process as claimed in claim 1, wherein said first conductor is a polysilicon layer.

4. A structure for preventing bonding pads from peeling caused by plug process as claimed in claim 1, wherein said metal spacers are tungsten spacers.

5. A structure for preventing bonding pads from peeling caused by plug process as claimed in claim 1, wherein said second conductor is a aluminum layer.

* * * * *